(12) United States Patent
Ding et al.

(10) Patent No.: US 8,436,446 B2
(45) Date of Patent: May 7, 2013

(54) METHOD, STRUCTURE, AND DESIGN STRUCTURE FOR A THROUGH-SILICON-VIA WILKINSON POWER DIVIDER

(75) Inventors: Hanyi Ding, Essex Junction, VT (US); Alvin J. Joseph, Williston, VT (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/455,725

(22) Filed: Apr. 25, 2012

(65) Prior Publication Data

US 2012/0212303 A1 Aug. 23, 2012

Related U.S. Application Data

(62) Division of application No. 12/548,033, filed on Aug. 26, 2009, now Pat. No. 8,216,912.

(51) Int. Cl.
*H01L 27/08* (2006.01)

(52) U.S. Cl.
USPC .................................. 257/536; 257/E27.047

(58) Field of Classification Search ........................ None
See application file for complete search history.

(56) References Cited

U.S. PATENT DOCUMENTS

| | | | |
|---|---|---|---|
| 4,611,184 A | 9/1986 | Kumar | |
| 4,945,321 A | 7/1990 | Oppelt et al. | |
| 5,926,077 A | 7/1999 | Milroy | |
| 6,501,415 B1 | 12/2002 | Viana et al. | |
| 6,861,923 B2 | 3/2005 | Kolehmainen et al. | |
| 7,242,266 B2 | 7/2007 | Peterson | |
| 7,893,526 B2 | 2/2011 | Mun et al. | |
| 2006/0028297 A1 | 2/2006 | Kang et al. | |
| 2006/0273455 A1 | 12/2006 | Williams et al. | |
| 2007/0109070 A1 | 5/2007 | Singh | |
| 2007/0222512 A1 | 9/2007 | Krishnamurthy et al. | |
| 2008/0073747 A1 | 3/2008 | Chao et al. | |
| 2009/0001602 A1 | 1/2009 | Chung | |
| 2009/0051045 A1 | 2/2009 | Mun et al. | |
| 2011/0033980 A1 | 2/2011 | Chung | |

FOREIGN PATENT DOCUMENTS

| | | |
|---|---|---|
| KR | 20080114030 A | 12/2008 |
| KR | 20090019523 A | 2/2009 |

OTHER PUBLICATIONS

International Search Report for Application No. PCT/US2010/045249 mailed May 2, 2011.
Written Opinion of the International Searching Authority for Application No. PCT/US2010/045249 dated Apr. 26, 2011.
Chiu et al. "A Novel Planar Three-Way Power Divider", IEEE Microwave and Wireless Components Letters, vol. 16, No. 8, Aug. 2006, pp. 449-451.
Scardelletti et al. "Miniaturized Wilkinson Power Dividers Utilizing Capacitive Loading", IEEE Microwave and Wireless Components Letters, vol. 12, No. 1, Jan. 2002, pp. 6-8.

*Primary Examiner* — Seahvosh Nikmanesh
(74) *Attorney, Agent, or Firm* — Anthony Canale; Roberts Mlotkowski Safran & Cole, P.C.

(57) ABSTRACT

A method, structure, and design structure for a through-silicon-via Wilkinson power divider. A method includes: forming an input on a first side of a substrate; forming a first leg comprising a first through-silicon-via formed in the substrate, wherein the first leg electrically connects the input and a first output; forming a second leg comprising a second through-silicon-via formed in the substrate, wherein the second leg electrically connects the input and a second output, and forming a resistor electrically connected between the first output and the second output.

9 Claims, 12 Drawing Sheets

METHOD, STRUCTURE, AND DESIGN STRUCTURE FOR A THROUGH-SILICON-VIA WILKINSON POWER DIVIDER

CROSS REFERENCE TO RELATED APPLICATIONS

The present application is a divisional application of copending U.S. application Ser. No. 12/548,033, filed on Aug. 26, 2009, the contents of which are incorporated by reference herein in its entirety.

FIELD OF THE INVENTION

The invention generally relates to semiconductor devices and, more particularly, to a method, structure, and design structure for a through-silicon-via Wilkinson power divider.

BACKGROUND

Wilkinson power dividers (also referred to as Wilkinson power splitters) are used extensively in phased array radar applications, and also in other RF applications, to split power from one line to two lines (or, alternatively, the combine power from two lines to one line). Typically, a millimeter wave (MMW) Wilkinson power divider (WPD) is implemented in a horizontal manner in the metal layers in the back-end-of-line (BEOL) processing of integrated circuit chips. As a result of their horizontally extending structure, WPDs take up a lot of space on the chip (e.g., have a large footprint).

More specifically, a WPD commonly includes an input wire that splits into two legs, a respective output at the end of each leg opposite the split, and a resistor connected between the two outputs. By definition, the legs of a WPD are of a specified length (e.g., one-quarter wavelength, i.e., $\lambda/4$) and the resistor is of a specified resistance (e.g., 2Zo), which results in the input and the two outputs all having a matched characteristic impedance (Zo). Moreover, the resistor isolates the two outputs from one another. In this way, a WPD improves over simple "Tee" and "Y" junctions by providing matching impedance at the input and output ports, and by providing isolation between the two output ports.

However, since the legs of a WPD must be of a particular length, there is a lower limit to the minimum footprint (e.g., the area when viewed in plan view) that can be achieved for adequate divider performance at a given frequency in a conventional metal-dielectric BEOL stack-up. That is to say, a large amount of chip space is required for a WPD when the legs of a WPD are implemented as horizontal traces in wiring levels above the wafer. As such, the necessary minimum size footprint of a conventionally oriented WPD negatively affects the overall cost of a phased array system.

Accordingly, there exists a need in the art to overcome the deficiencies and limitations described hereinabove.

SUMMARY

In a first aspect of the invention, there is a method of forming a power divider, comprising: forming an input on a first side of a substrate; forming a first leg comprising a first through-silicon-via formed in the substrate, wherein the first leg electrically connects the input and a first output; forming a second leg comprising a second through-silicon-via formed in the substrate, wherein the second leg electrically connects the input and a second output, and forming a resistor electrically connected between the first output and the second output.

In another aspect of the invention, there is a semiconductor structure, comprising: an input in a first layer on a substrate; a first output and a second output in a second layer on the substrate; a first leg comprising a first through-silicon via extending through the substrate and electrically connected between the input and the first output; a second leg comprising a second through-silicon via extending through the substrate and electrically connected between the input and the second output; and a resistor electrically connected between the first output and the second output.

In another aspect of the invention, there is a design structure tangibly embodied in a machine readable medium for designing, manufacturing, or testing an integrated circuit. The design structure comprises: an input in a first layer on a substrate; a first output and a second output in a second layer on the substrate; a first leg comprising a first through-silicon via extending through the substrate and electrically connected between the input and the first output; a second leg comprising a second through-silicon via extending through the substrate and electrically connected between the input and the second output; and a resistor electrically connected between the first output and the second output.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to semiconductor devices and, more particularly, to a method, structure, and design structure for a through-silicon-via Wilkinson power divider. In embodiments, a Wilkinson power divider (WPD) utilizes a through-silicon-via (TSV) as a portion of the leg of the power divider. In this manner, the requisite leg length of a WPD may be achieved using a substantially vertical TSV in otherwise unused space within the chip. By using a vertically oriented TSV for the legs, instead of primarily using horizontally oriented traces in wiring levels above the chip, implementations of the invention achieve a reduction in size of the footprint of the WPD. In this manner, the entire chip may be made smaller. Implementations of the invention may be used in MMW phased array systems to provide more efficient use of the silicon in the phased array application. For example, implementations of the invention may be used as Wilkinson Power Dividers in stacked-chip phased-array radar designs.

Figure 1:
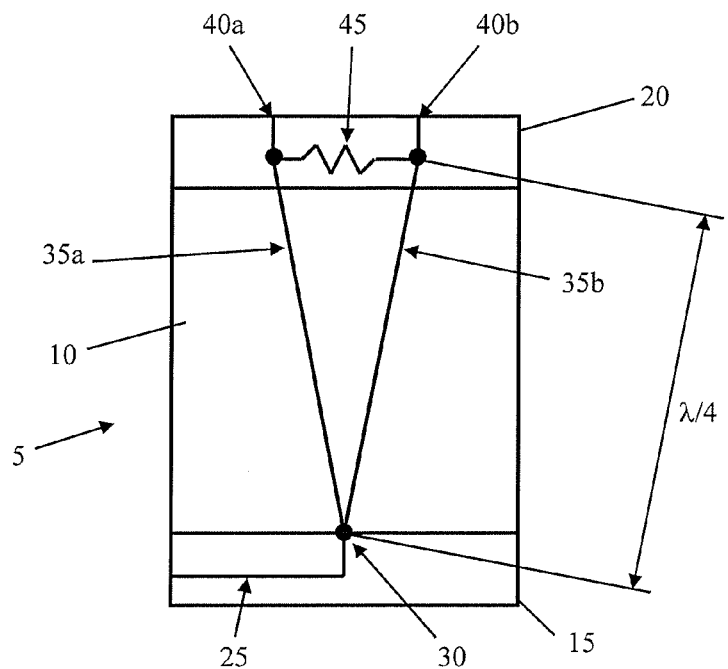
FIG. 1 shows a generalized circuit diagram of a power divider in accordance with aspects of the invention.

FIG. 1 shows a generalized circuit diagram of a WPD 5 in accordance with aspects of the invention. In embodiments, the WPD 5 is implemented in a semiconductor substrate 10 having at least one wiring layer 15 on the back side (e.g., bottom) of the substrate 10 and at least one wiring layer 20 on the front side (e.g., top) of the substrate 10. An input 25 (e.g., a signal line) at one side of the substrate splits at node 30 into two legs 35a, 35b of the power divider. In accordance with aspects of the invention, the legs 35a, 35b are embodied as through-silicon-vias (also known as through-substrate-vias, and through-wafer-vias) in the substrate 10. Each leg 35a, 35b is connected to a respective output 40a, 40b at a side of the substrate 10 opposite the side of the input 25, and an on-chip resistor 45 is connected between the outputs 40a, 40b. A length of each leg 35a, 35b between the splitting node 30 and the resistor 45 is substantially equal to a quarter-wavelength (e.g., λ/4), and the resistor 45 has a resistance of substantially 2Zo, e.g., twice the desired characteristic impedance (Zo) of the input 25 and output 40a, 40b signal lines.

Figure 2:
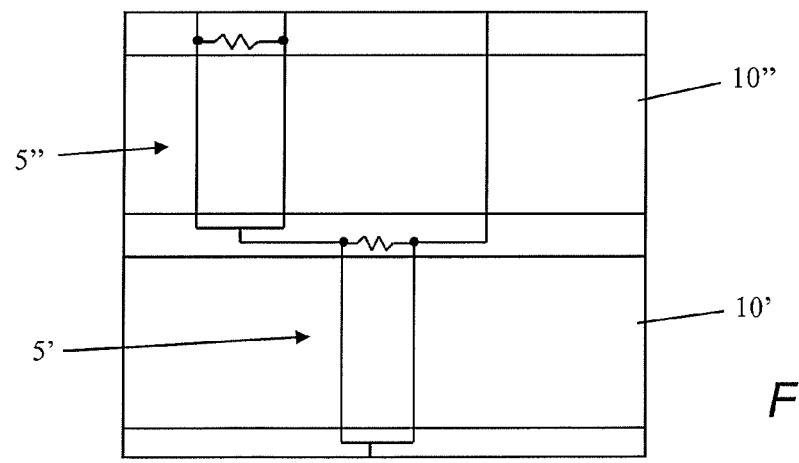
FIG. 2 diagrammatically shows power dividers in accordance with aspects of the invention employed in a stacked-chip configuration.

FIG. 2 diagrammatically shows WPDs in accordance with aspects of the invention employed in a stacked-chip configuration. More specifically, FIG. 2 shows a first substrate 10' and a second substrate 10" connected in a stacked-chip configuration, such as, for example, a stacked-chip phased-array radar design. A first WPD 5' is arranged in the first substrate 10' and a second WPD 5" is arranged in the second substrate 10". In this manner, it can be seen that implementations of the invention may be used to reduce the overall size of stacked chip configurations.

Figure 3:
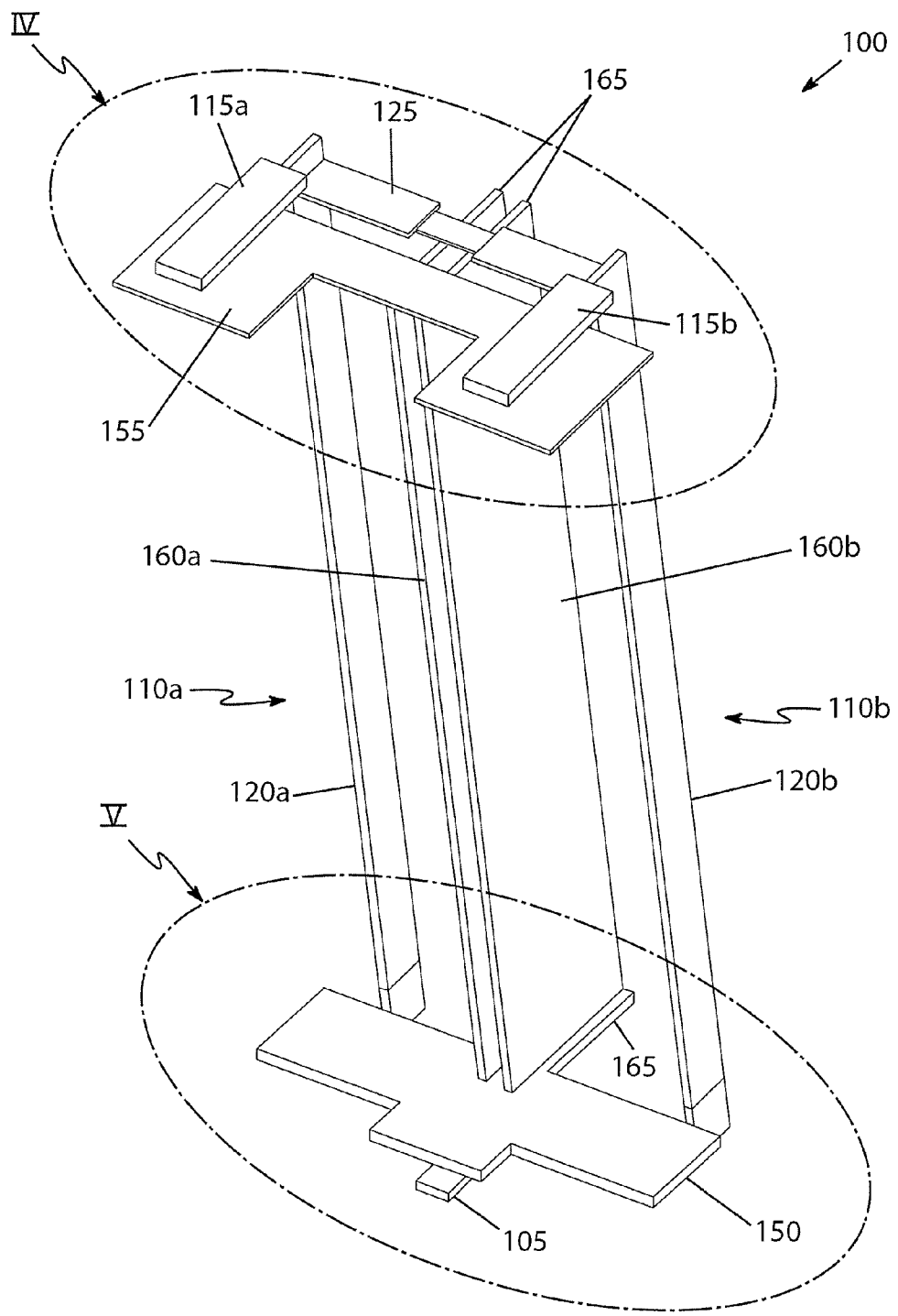
FIGS. 3-6 show views of portions of a power divider in accordance with aspects of the invention.
Figure 4:
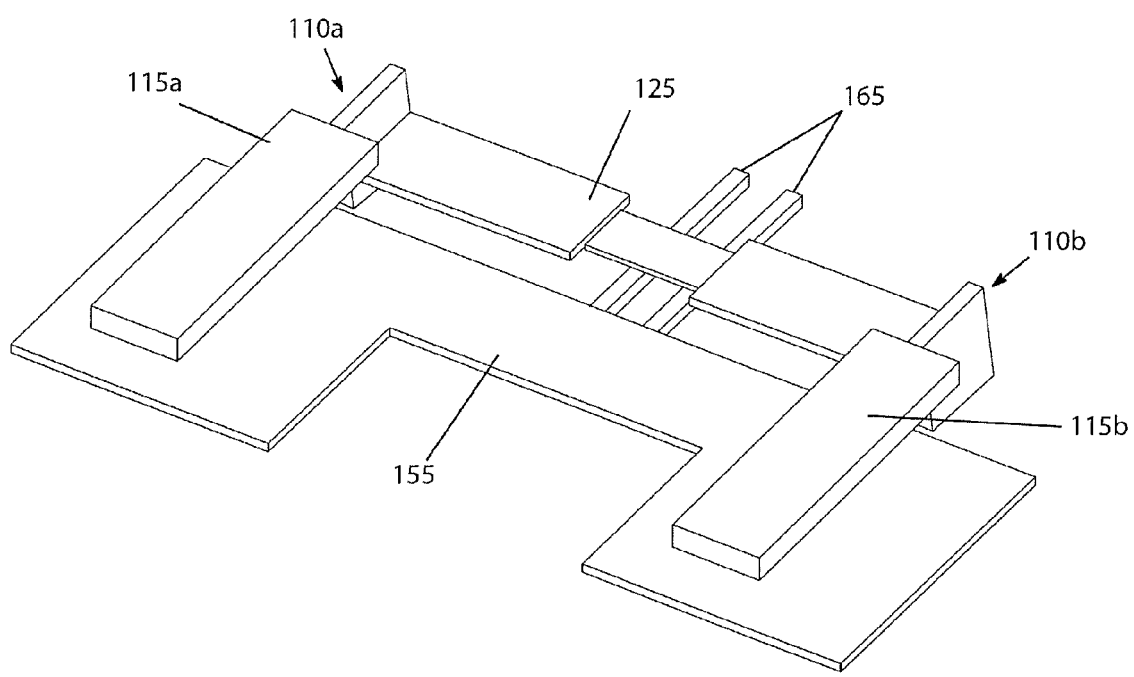
Figure 5:
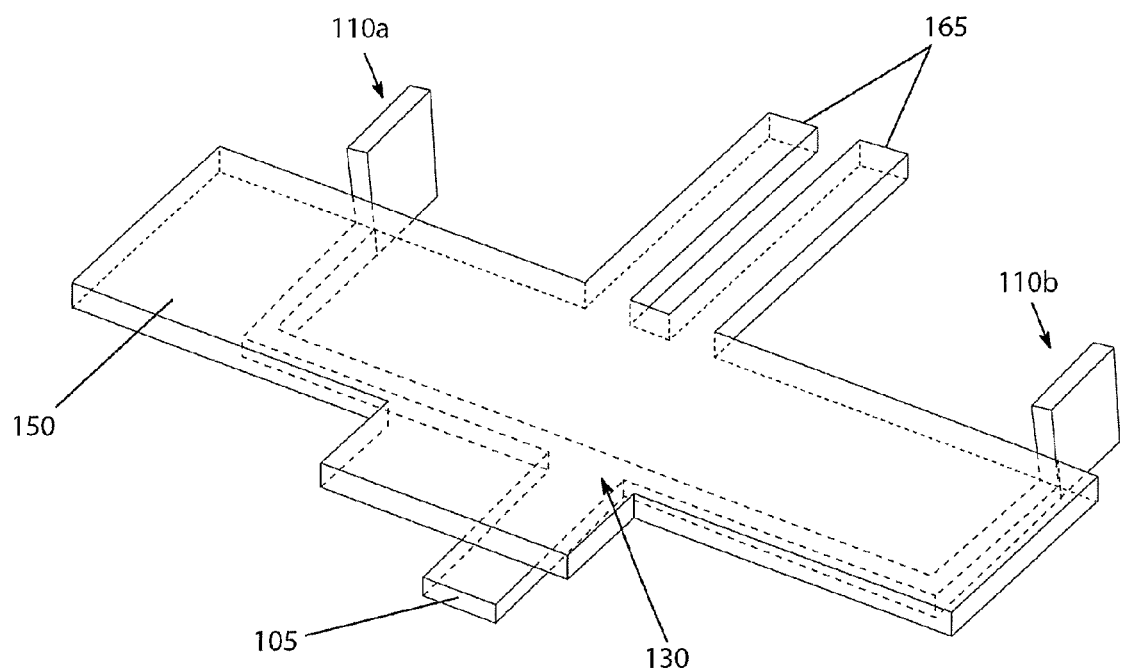

FIGS. 3-5 show views of a TSV WPD 100 in accordance with aspects of the invention. More specifically, FIGS. 3-5 show conductive elements that may be formed in a layered semiconductor structure. However, for clarity, the substrate and wiring levels are omitted from view in FIGS. 3-5. FIG. 3 shows a transmission line structure including through silicon via signal lines, while FIGS. 4 and 5 show magnified views of portions IV and V of FIG. 3, respectively. As described in greater detail below with respect to FIG. 6, the structures described herein may be formed using conventional semiconductor fabrication techniques and may be composed of any suitable materials.

As depicted in FIGS. 3-5, the WPD 100 includes a signal line input 105, which may correspond to input 25 described above. In embodiments, the input 105 comprises a portion of a signal line (e.g., a wire trace of a microstrip transmission line) that is formed in a layer (e.g., wiring level, metallization layer, etc.) on the back side of a substrate. The WPD 100 also includes first and second legs 110a, 110b arranged between the input 105 and first and second outputs 115a, 115b. In accordance with aspects of the invention, the first and second outputs 115a and 115b are formed in a layer on the front side of the substrate, and the first and second legs 110a and 110b comprise respective first and second signal TSVs 120a, 120b that are formed in the substrate and that electrically connect the input 105 and the outputs 115a, 115b. The WPD 100 also includes a resistor 125 formed in a layer on the front side of the substrate. In embodiments, the first and second legs 110a and 110b split from the input 105 at a location 130 in the same layer as the input.

In embodiments, the input 105, legs 110a and 110b, outputs 115a and 115b, resistor 125, and location 130 may correspond, respectively, to the input 25, legs 35a and 35b, outputs 40a and 40b, resistor 45, and node 30 described above with respect to FIG. 1. In this manner, the WPD 100 comprises TSVs.

Still referring to FIGS. 3-5, in embodiments, the WPD 100 may further comprise ground plane structures. In this manner, the WPD 100 may comprise a microstrip transmission line and TSVs. For example, a first ground plane 150 may be formed in another layer on the back side of the substrate, the another layer being different from the layer in which the input 105 is formed. In embodiments, the first ground plane 150 is formed between the input 105 and the substrate, and may be sized relative to the input 105 and legs 110a, 110b in accordance with conventional microstrip transmission line techniques.

Additionally, a second ground plane 155 may be formed in another layer on the front side of the substrate, the another layer being different from the layers in which the outputs 115a, 115b and resistor 125 are formed. In embodiments, the second ground plane 155 is formed between the outputs 115a, 115b and the substrate, and may be sized relative to the outputs 115a, 115b in accordance with conventional microstrip transmission line techniques.

As depicted in FIG. 3, the WPD 100 may further include first and second ground TSVs 160a, 160b formed through the substrate, and connected between the first ground plane 150 and the second ground plane 155. For example, the first ground plane 150 and the second ground plane 155 may comprise take-off portions 165 formed in their respective layers for providing an electrical connection to the first and second ground TSVs 160a, 160b. In embodiments, the first and second ground TSVs 160a, 160b may be sized relative to the first and second signal TSVs 120a, 120b in accordance with conventional microstrip transmission line techniques.

Figure 6:
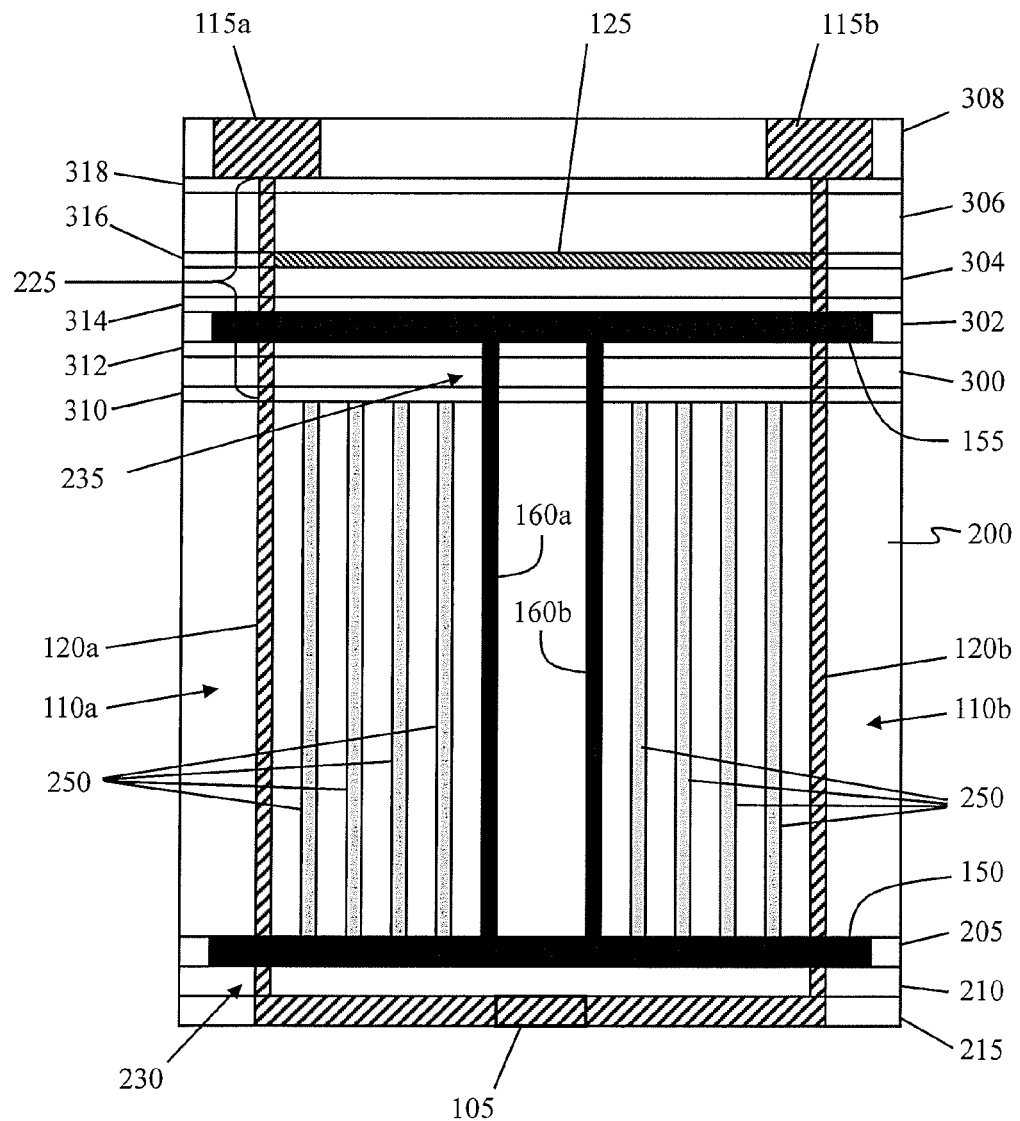

FIG. 6 shows a cross-sectional view of layered semiconductor structure comprising WPD 100 in accordance with aspects of the invention. As depicted in FIG. 6, in embodiments, the WPD 100 is at least partially formed in a semiconductor substrate 200. The substrate 200 may be any conventional silicon-based semiconductor substrate, including but not limited to: Si, SiGe, SiC, SiGeC, and layered semiconductors such as silicon-on-insulator (SOI), Si/SiGe, and SiGe-on-insulator (SGOI).

In embodiments, the structure includes layers 205, 210, and 215 formed on the back side of the substrate 200. The structure may also include plural wiring levels (e.g., layers 300, 302, 304, 306, 308) and via layers (e.g., 310, 312, 314, 316, 318) formed on the front side of the substrate 200. The layers (e.g., 205, 210, and 215), wiring levels (e.g., layers 300, 302, 304, 306, 308), and via layers (e.g., 310, 312, 314, 316, 318) may comprise any conventional metals, e.g., copper, tungsten, aluminum, etc., and any conventional dielectric material, such as, for example, silicon dioxide ($SiO_2$), tetraethylorthosilicate (TEOS), borophosphosilicate glass BPSG, etc., and may be formed using conventional semiconductor fabrication techniques, e.g., chemical vapor deposition (CVD), etc.

In embodiments, the input 105 is formed as conductive material arranged in layer 215, the outputs 115a, 115b are formed as conductive material arranged in layer 308, the resistor 125 is formed as conductive material arranged in layer 316, and the signal TSVs 120a, 120b are formed as conductive material arranged in the substrate 200. These features, and all other features described herein, may be fabricated using techniques including, but not limited to: photolithographic masking and etching, chemical vapor deposition (CVD), metal deposition, chemical mechanical polish (CMP), etc., which are well known in the art such that further explanation is not believed necessary for an understanding of the invention.

In accordance with aspects of the invention, additional conductive material may be formed in any desired layers in order to connect the signal TSVs 120a, 120b to the input 105 and to the respective outputs 115a, 115b. For example, the first leg 110a may comprise an upper portion 225 comprising conductive material formed in wiring levels (e.g., layers 300, 302, 304, and 306) and via layers (e.g., 310, 312, 314, 316, and 318) to electrically connect the first signal TSV 120a to the first output 115a. Similarly, the first leg 110a may comprise a lower portion 230 comprising conductive material formed in layers 205, 210, and 215 to electrically connect the first signal TSV 120a to the input 105. Similar structures may be formed for the second leg 110b.

Still referring to FIG. 6, in embodiments, the first ground plane 150 is formed as conductive material arranged in layer 205, the second ground plane 155 is formed as conductive material arranged in layer 302, and the first and second ground TSVs 160a, 160b are formed as conductive material in the substrate 200. Similar to portions 225 and 230, extensions 235 may be formed as conductive material in layers 310, 300, and 312 to connect the first and second ground TSVs 160a, 160b to the second ground plane 155.

Although FIG. 6 shows the various features of the WPD 100 formed in specific layers, it is noted that the invention is not limited to the specific configuration depicted in FIG. 6. Rather, wafers with any desired numbers of layers may be used within the scope of the invention and/or the various features of the WPD 100 may be formed in any suitable layers.

According to aspects of the invention, the conductive features of the WPD 100 depicted in FIGS. 3-6 may be composed of any desired conductive material, including but not limited to, copper, aluminum, tungsten, alloys, doped semiconductor material, etc. However, the invention is not limited to any particular materials, and the conductive features may be composed of any combination of conventional conductive material(s).

In implementations of the invention, the features of the WPD 100 may be formed having any suitable dimensions. Particularly, these features may be sized and shaped to achieve a desired characteristic impedance (e.g., 50 Ohm) for the input 105 and the first and second outputs 115a and 115b. Additionally or alternatively, these features may be sized and shaped to achieve desired center operating frequency (e.g., 60 GHz) for the WPD 100.

By way of non-limiting example, the input 105 may have a thickness (e.g., height) of about 4 μm and a width of about 10 μm to about 15 μm. Also, the first and second outputs 115a and 115b may have a height of about 4 μm and a width of about 13 μm to about 17 μm. In embodiments, the first ground plane 150 may have a height of about 4 μm, and a bottom surface of the first ground plane may be about 10 μm away from a top surface of the input 105. Also, the second ground plane 155 may have a height of about 0.32 μm, with a top surface of the second ground plane 155 being about 11 μm away from a bottom surface of the first and second outputs 115a and 115b. The length and width of the first and second ground planes 150, 155 are not critical to the invention, and, as such, any suitable length and width that serves to adequately cover the associated signal lines, in accordance with conventional microstrip transmission line techniques, may be used within the scope of the invention. Moreover, the invention is not limited to the particular dimensions described herein, and any suitable dimensions may be used, depending for example on the desired characteristic impedance and center operating frequency.

Additionally, the first and second signal TSVs 120a and 120b may have a width of about 3 μm and a length of about 13 μm to about 17 μm. Additionally, the first and second ground TSVs 160a, 160b may have a width of about 3 μm and a length of about 45 μm. The first and second signal TSVs 120a, 120b and the first and second ground TSVs 160a, 160b all have a height substantially equal to the thickness (e.g., height) of the substrate in which they are formed. As a non-limiting example, this height may be about 300 μm. However, the invention is not limited to these dimensions, and any suitable dimensions may be used, for example, to obtain a desired characteristic impedance and center operating frequency. Moreover, as described in greater detail below, the height of the substrate, and therefore of the TSVs, may be selectively adjusted (e.g., by grinding, thinning, etc.) in order to tune the center operating frequency of the WPD 100.

Still referring to FIG. 6, one or more insulator-filled TSVs 250 may be used within the scope of the invention. In embodiments, the one or more insulator-filled TSVs 250 comprise TSVs formed in the substrate 200 and filled with an insulator material instead of a conductive material. In accordance with aspects of the invention, the one or more insulator-filled TSVs 250 are arranged between the first and second signal TSVs 120a, 120b and the first and second ground TSVs 160a, 160b to selectively adjust the operating characteristics of the WPD 100. For example, the one or more insulator-filled TSVs 250 may be filled with silicon dioxide ($SiO_2$), which has a different (e.g., lower) dielectric constant than the material of the substrate 200. As such, when such an insulator filled TSV is arranged between a signal TSV and a ground TSV, the loss characteristics of the signal line may be improved.

In embodiments, the one or more insulator-filled TSVs 250 have substantially the same dimensions as the first and second ground TSVs 160a, 160b; however, any size may be used within the scope of the invention. Moreover, any number of insulator-filled TSVs 250 may be arranged between the respective signal and ground TSV in accordance with aspects of the invention.

Figure 7:
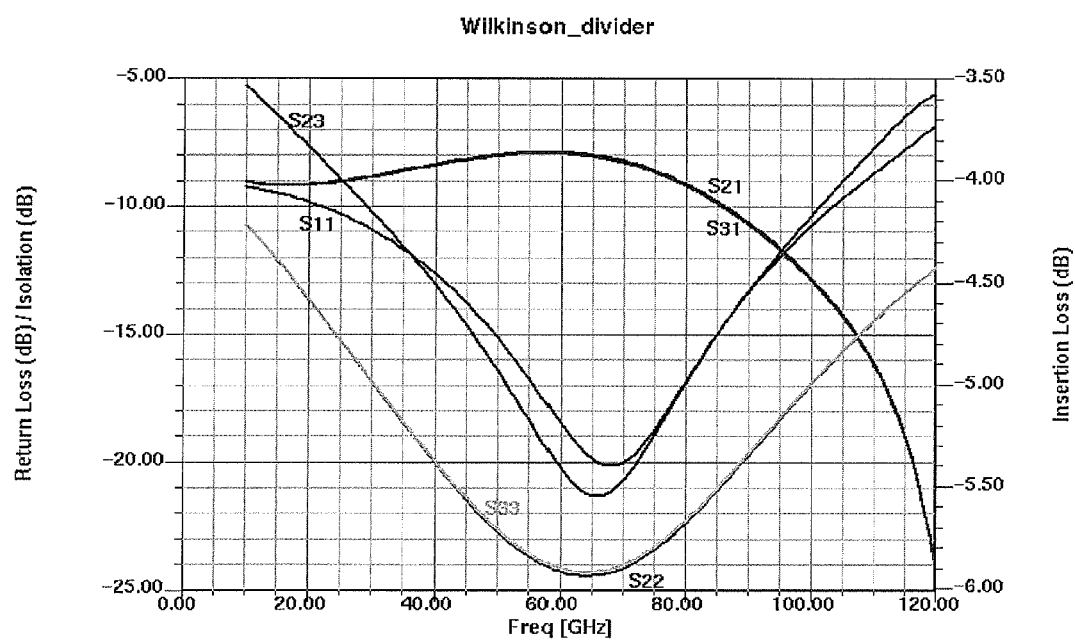
FIG. 7 shows plots of data associated with simulations of structures in accordance with aspects of the invention.

FIG. 7 shows plots of data associated with simulations of structures in accordance with aspects of the invention. Particularly, FIG. 7 shows various data of a simulated transmission line structure similar to the WPD 100 described above, wherein the simulated transmission line structure is configured as having a characteristic impedance of about 50 Ohm and a center operating frequency of about 60 GHz. In FIG. 7, a label "1" represents the input, a label "2" represents a first output, and a label "3" represents a second output. For example, the curve "S23" represents the isolation loss between the first and second outputs, while curve "S21" represents the insertion loss between the input and the first output, etc.

More specifically, curves "S21" and "S31" show the insertion loss between the input and respective outputs of the transmission line structure. As can be seen from FIG. 7, at the operating frequency (e.g., about 60 GHz), the insertion loss is about 3.8 dB, which is very close to the ideal value of 3.0 dB for an ideal WPD. It is noted that the insertion loss of about 0.8 dB is for a simulated transmission line structure having signal TSVs filled with tungsten, and that the use of copper instead of tungsten would improve this insertion loss even more.

Curve "S23" which shows the isolation loss between the first and second outputs, demonstrates that the simulated transmission line structure performs as a WPD. For example, both the return loss and the isolation are better than 15 dB, and the simulated transmission line structure exhibits perfect phase balance and amplitude balance.

Moreover, the simulated transmission line structure associated with FIG. 7, which corresponds to the WPD 100 described with respect to FIGS. 3-6, has a footprint (e.g., area in plan view) of about 145 μm in width and about 95 μm in length. This relatively small footprint results from the legs of the WPD of the being formed as TSVs, e.g., substantially vertically through the substrate instead of horizontally in wiring level above the substrate. Accordingly, the footprint for the transmission line structure formed in accordance with aspects of the invention is smaller than that which can be achieved using conventional horizontally-oriented WPDs.

In accordance with further aspects of the invention, the center operating frequency of a transmission line structure having a TSV WPD in accordance with aspects of the invention may be selectively adjusted by way of the thickness of the substrate and the size and number of insulator-filled TSVs used. For example, in embodiments, the thickness of the substrate is adjusted (e.g., by milling, grinding, thinning, etc.) so that legs of the WPD, including the signal TSVs, have a length of λ/4 for a predetermined center operating frequency. In this manner, implementations of the transmission line structure having a TSV WPD in accordance with aspects of the invention may be tuned to a predetermined center operating frequency and characteristic impedance.

Figure 8:
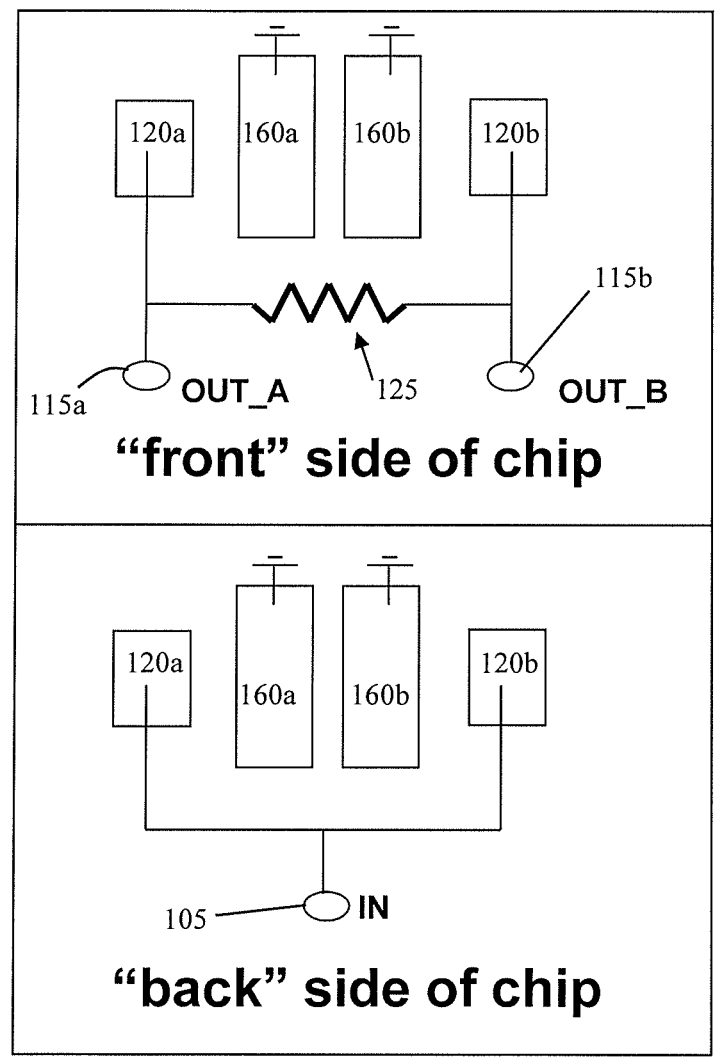
FIGS. 8-12 show diagrams of embodiments of power dividers in accordance with aspects of the invention.

FIGS. 8-12 show schematic diagrams of embodiments of power dividers in accordance with aspects of the invention. For example, FIG. 8 shows a diagram of a transmission line which corresponds to the WPD 100 described with respect to FIGS. 3-6. Particularly, FIG. 8 diagrammatically shows the input 105, outputs 115a, 115b, signal TSVs 120a, 120b, resistor 125, and ground TSVs 160a, 160b at the respective front and back side of the chip (e.g., substrate).

Figure 9:
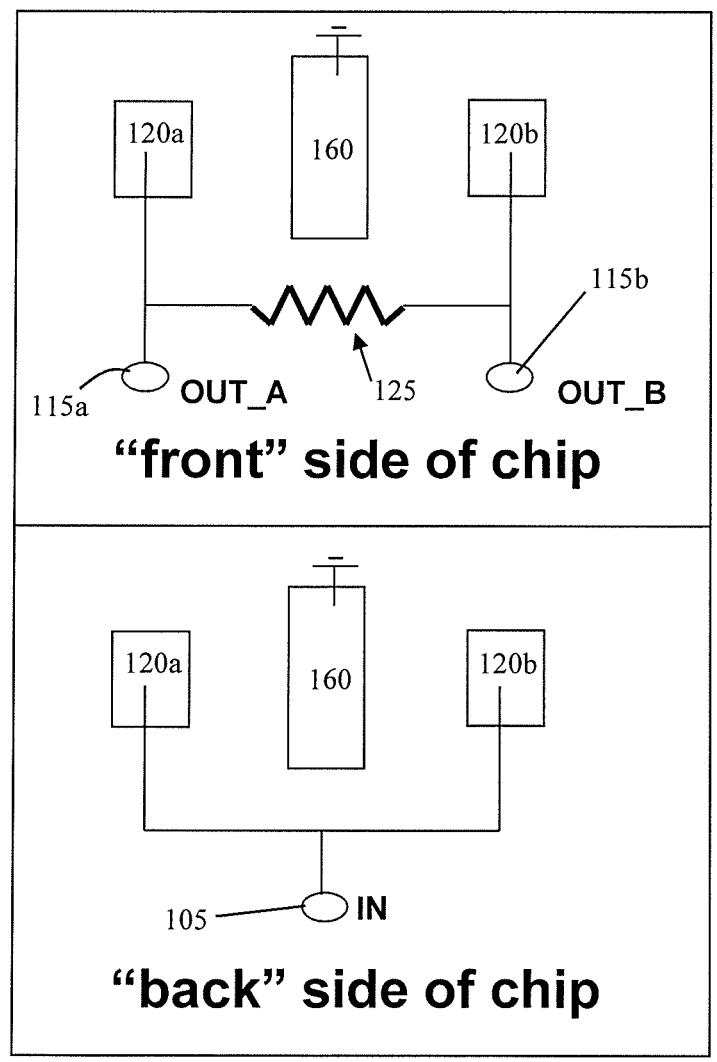

FIG. 9 shows an embodiment having an input 105, outputs 115a, 115b, signal TSVs 120a, 120b, and resistor 125. Instead of first and second ground TSVs 160a, 160b, the embodiment in FIG. 9 shows a single ground TSV 160 arranged between the signal TSVs 120a, 120b. This embodiment can be used to make the device smaller.

Figure 10:
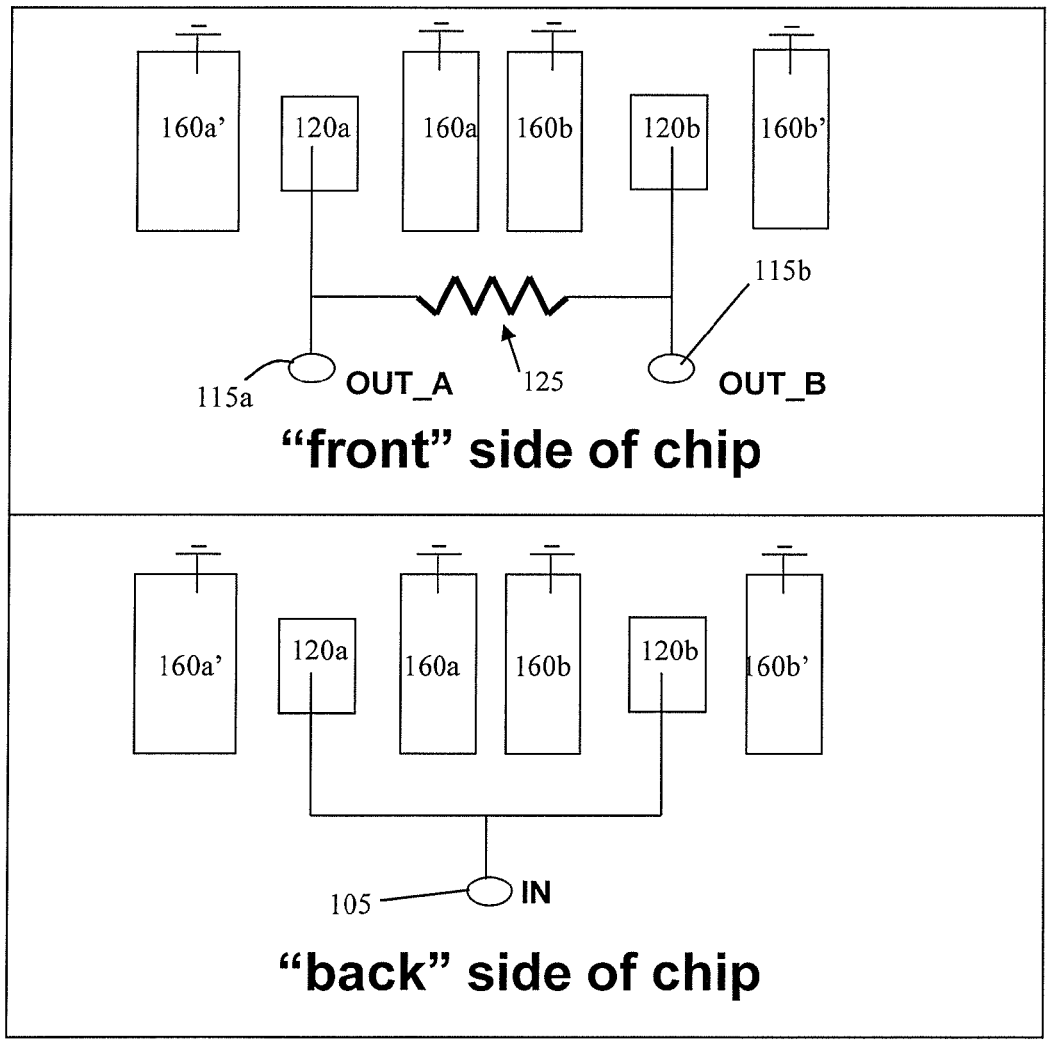

FIG. 10 shows an embodiment having an input 105, outputs 115a, 115b, signal TSVs 120a, 120b, resistor 125, and ground TSVs 160a, 160b. The embodiment of FIG. 10 also has an additional grounds TSVs 160a' and 160b' arranged in a stripline configuration around the signal TSVs 120a, 120b.

Figure 11:
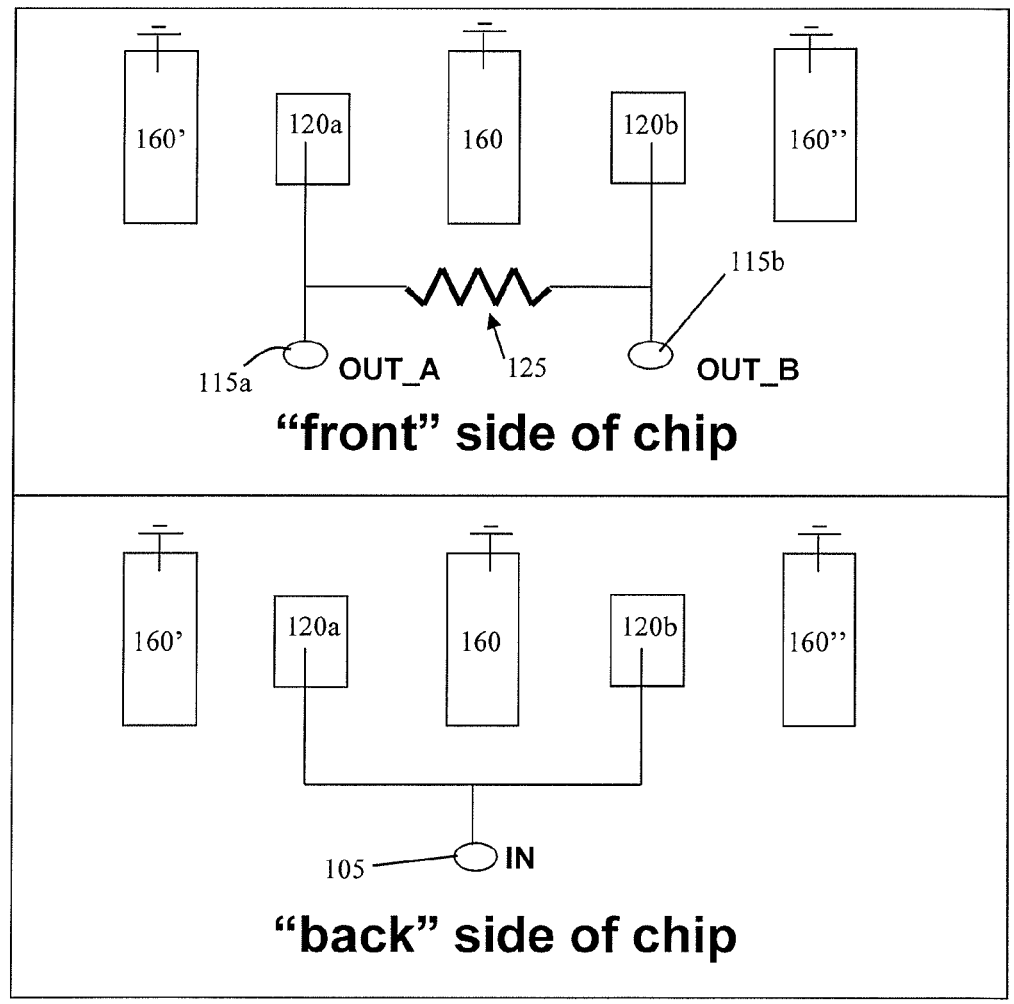

FIG. 11 shows an embodiment having an input 105, outputs 115a, 115b, signal TSVs 120a, 120b, resistor 125. In this configuration, three ground TSVs 160, 160', and 160" are arranged around the signal TSVs 120a, 120b in a stripline configuration.

Figure 12:
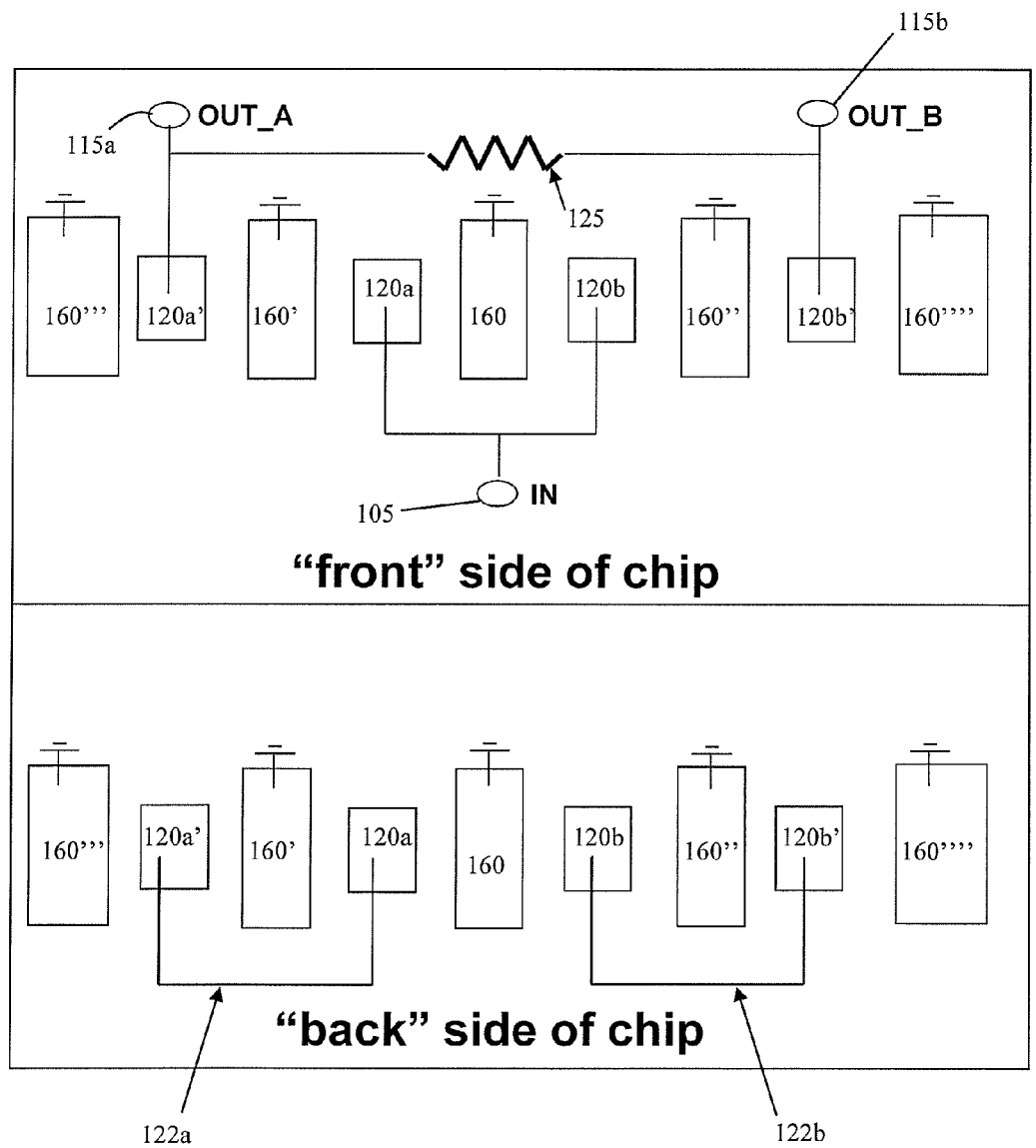

FIG. 12 shows an embodiment in which the input 105 and the outputs 115a and 115b are arranged on the same side of the chip (e.g., substrate). In this embodiment, each leg of the WPD comprises two signal TSVs. For example, the first leg of the WPD comprises signal TSVs 120a and 120a', and the second leg of the WPD comprises signal TSVs 120b and 120b'. Electrical connection 122a is provided on the back side of the chip to electrically connect the signal TSVs 120a and 120a' of the first leg. Also, electrical connection 122b is provided on the back side of the chip to electrically connect the signal TSVs 120b and 120b' of the second leg. In this manner, the length of each leg of the WPD can be effectively doubled. The embodiment depicted in FIG. 12 also includes appropriate ground TSVs 160, 160', 160", 160''', and 160''''.

Figure 13:
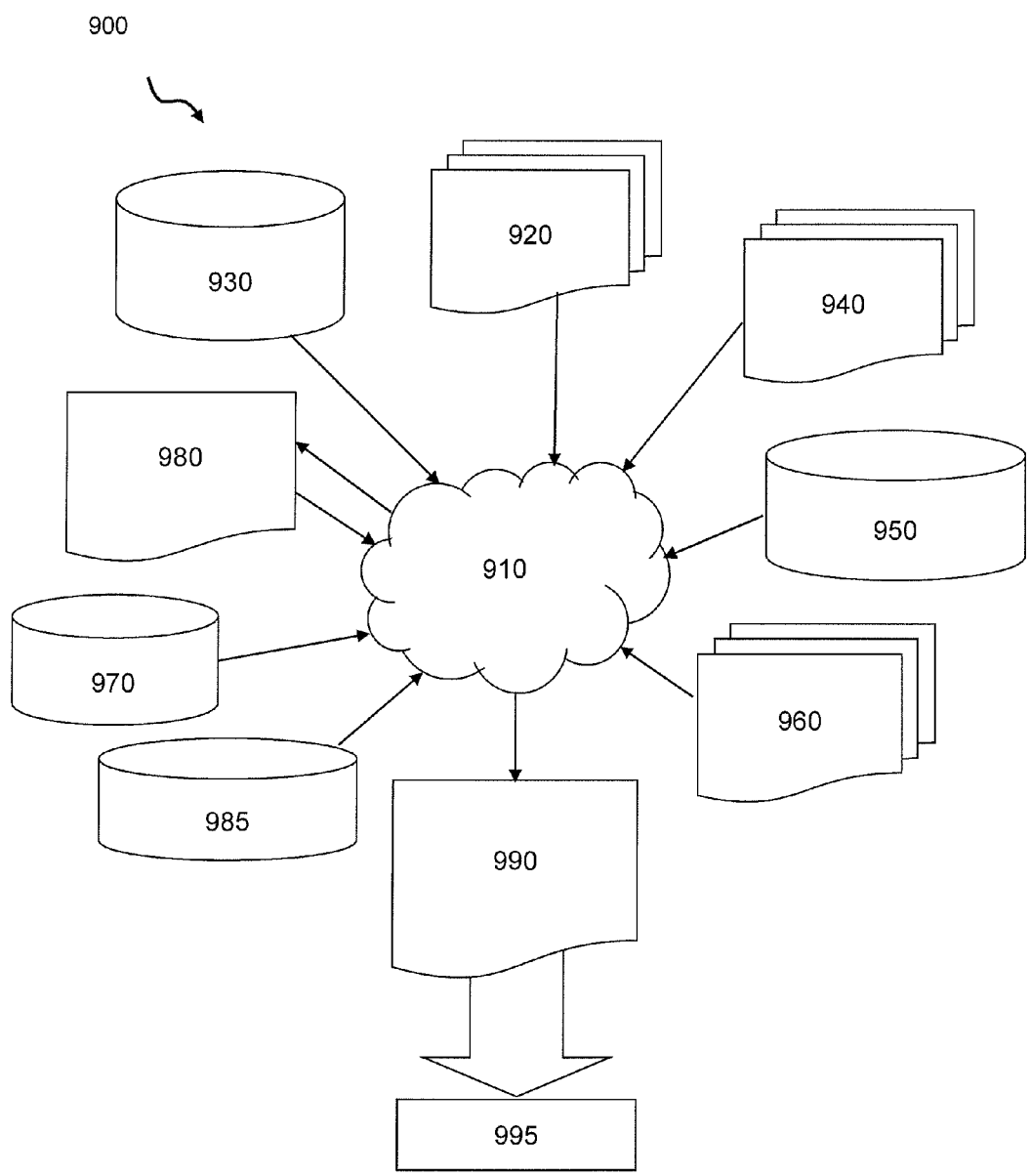
FIG. 13 is a flow diagram of a design process used in semiconductor design, manufacture, and/or test.

FIG. 13 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-6 and 8-12. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6 and 8-12. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 and 8-12 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6 and 8-12. In one embodiment, design structure 990 may comprise a compiled, executable HDL simulation model that functionally simulates the devices shown in FIGS. 1-6 and 8-12.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6 and 8-12. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A semiconductor structure, comprising:
   an input in a first layer on a substrate;
   a first output and a second output in a second layer on the substrate;
   a first leg comprising a first through-silicon via extending through the substrate and electrically connected between the input and the first output;
   a second leg comprising a second through-silicon via extending through the substrate and electrically connected between the input and the second output; and
   a resistor electrically connected between the first output and the second output.

2. The structure of claim 1, wherein:
   the first layer is on a first side of the substrate, and
   the second layer is on a second side of the substrate different from the first side.

3. The structure of claim 2, further comprising at least one ground through-silicon via extending through the substrate between the first through-silicon via and the second through-silicon via.

4. The structure of claim 3, further comprising at least one insulator-filled through-silicon-via in the substrate between the at least one ground through-silicon-via and at least one of the first through-silicon-via and the second through-silicon-via.

5. The structure of claim 1, wherein the input, the first leg, the second leg, the resistor, the first output, and the second output collectively constitute a Wilkinson power divider.

6. A power divider, comprising:
   an input on a first side of a substrate;
   a first leg comprising a first through-silicon-via in the substrate, wherein the first leg electrically connects the input and a first output;
   a second leg comprising a second through-silicon-via in the substrate, wherein the second leg electrically connects the input and a second output; and
   a resistor electrically connected between the first output and the second output,
   wherein the first leg and the second leg are split from the input at a common node, which is connected to the input.

7. The power divider of claim 6, wherein:
   the first through-silicon-via and the second through-silicon-via extend substantially vertically through the substrate, and
   the first leg, the second leg, and the resistor comprise a predetermined characteristic impedance at the input, the first output, and the second output.

8. The power divider of claim 6, further comprising the first output and the second output are in another layer of dielectric material on a second side of the substrate opposite the first side of the substrate.

9. A power divider, comprising:
   an input on a first side of a substrate;
   a first output on a second side of the substrate;
   a second output on the second side of the substrate;
   a first vertically oriented signal through silicon vias through the substrate between the first side and the second side, and in contact with the input and the first output, the vertically oriented first signal through silicon via being of a length of 2l4;
   a second vertically oriented signal through silicon vias through the substrate between the first side and the second side, and in contact with the input and the second output, the second vertically oriented signal through silicon via being of a same length as the first vertically oriented signal through silicon vias.

* * * * *